(12) United States Patent
Liebmann et al.

(10) Patent No.: US 6,553,559 B2
(45) Date of Patent: Apr. 22, 2003

(54) METHOD TO DETERMINE OPTICAL PROXIMITY CORRECTION AND ASSIST FEATURE RULES WHICH ACCOUNT FOR VARIATIONS IN MASK DIMENSIONS

(75) Inventors: Lars W. Liebmann, Poughquag, NY (US); Scott Mansfield, Hopewell Junction, NY (US); Alfred K. Wong, Pokfulam (HK)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 09/754,910

(22) Filed: Jan. 5, 2001

(65) Prior Publication Data

US 2002/0091985 A1 Jul. 11, 2002

(51) Int. Cl.⁷ .............................................. G06F 17/50
(52) U.S. Cl. ........................................... 716/19; 716/21
(58) Field of Search ............................ 716/1–21; 430/5, 430/22, 30

(56) References Cited

U.S. PATENT DOCUMENTS

| | | | |
|---|---|---|---|
| 5,242,770 A | 9/1993 | Chen et al. | 430/5 |
| 5,447,810 A | 9/1995 | Chen et al. | 430/5 |
| 5,636,002 A | 6/1997 | Garofalo | 355/53 |
| 5,705,301 A | 1/1998 | Garza et al. | 430/22 |
| 5,821,014 A | 10/1998 | Chen et al. | 430/5 |
| 5,862,058 A | 1/1999 | Samuels et al. | 716/21 |
| 5,879,866 A * | 3/1999 | Starikov et al. | 216/38 |
| 5,900,340 A | 5/1999 | Reich et al. | 430/22 |
| 5,920,487 A | 7/1999 | Reich et al. | 716/21 |
| 5,965,306 A * | 10/1999 | Mansfield et al. | 430/22 |
| 5,994,009 A | 11/1999 | Tzu et al. | 430/30 |
| 6,004,701 A * | 12/1999 | Uno et al. | 430/5 |
| 6,033,814 A | 3/2000 | Burdorf et al. | 430/30 |
| 6,081,658 A | 6/2000 | Rieger et al. | 716/21 |
| 6,127,071 A * | 10/2000 | Lu | 430/30 |
| 6,128,067 A * | 10/2000 | Hashimoto | 355/52 |
| 6,185,727 B1 * | 2/2001 | Liebmann | 430/394 |
| 6,194,104 B1 * | 2/2001 | Hsu | 430/5 |
| 6,268,093 B1 * | 7/2001 | Kenan et al. | 382/144 |
| 6,269,472 B1 * | 7/2001 | Garza et al. | 716/21 |
| 6,278,515 B1 * | 8/2001 | Knight et al. | 250/216 |
| 6,303,252 B1 * | 10/2001 | Lin | 430/5 |
| 6,335,129 B1 * | 1/2002 | Asano et al. | 250/492.21 |
| 6,338,922 B1 * | 1/2002 | Liebmann et al. | 430/5 |
| 2002/0019729 A1 * | 2/2002 | Chang et al. | 703/6 |
| 2002/0021434 A1 * | 2/2002 | Nomura et al. | 355/55 |
| 2002/0048288 A1 * | 4/2002 | Kroyan et al. | 372/20 |

* cited by examiner

*Primary Examiner*—Vuthe Siek
*Assistant Examiner*—Sun James Lin
(74) *Attorney, Agent, or Firm*—Todd M. C. Li; Whitham, Curtis & Christofferson, P.C.

(57) ABSTRACT

Optical proximity correction (OPC) and assist feature rules are generated using a process window (PW) analysis. A reference pitch is chosen and the mask bias is found that optimizes the process window. This can be done using standard process window analysis or through a weighted process window (WPW) analysis which accounts for focus and dose distributions that are expected in a real process. The WPW analysis gives not only the optimum mask bias, but also the center focus and dose conditions for the optimum process centering. A series of other pitches and mask biases are then analyzed by finding the common process window with the reference pitch. For the standard PW analysis, a common process window is found. For the WPW analysis, the WPW is computed at the center focus and dose conditions found for the reference pitch. If mask or lens errors are to be accounted for, then multiple structures can be included in the analysis. Once the common process windows for the mask features of interest have been computed, functional fits to the data can be found. Once the functional forms have been found for each of the OPC parameters, the rules table can be determined by solving for the spacings of interest in the design.

38 Claims, 9 Drawing Sheets

METHOD TO DETERMINE OPTICAL PROXIMITY CORRECTION AND ASSIST FEATURE RULES WHICH ACCOUNT FOR VARIATIONS IN MASK DIMENSIONS

BACKGROUND OF THE INVENTION

1. Field of the Invention

The present invention generally relates to integrated circuit (IC) manufacture, and more particularly to the correction of line-width deviations in optical lithography systems used to print a pattern on a photoresist layer on a semiconductor wafer.

2. Background Description

There is a continuing effort to reduce the dimensions of integrated circuit (IC) devices, and this has required greater precision in the tools used to manufacture IC devices. IC devices are designed using computer-aided design (CAD) layout tools which allow chip manufacturers to plan the layout of the circuits on a semiconductor wafer. The finished designs must be transferred to the wafer in a manner that allows device features to be produced by various processes of etching, depositing, implanting, and the like. This is done by applying a photoresist layer to the surface of the wafer and then exposing the photoresist with radiation through a mask having a pattern of transparent and opaque areas according to the feature to be formed. The photoresist is developed to provide openings in the photoresist layer through which the surface of the wafer is exposed for the process desired. This process of transferring the pattern to the wafer is generally referred to as photolithography.

In order to optimize the photolithography process, a process window is computed to print a feature or features of interest under various conditions. The process window is computed by measuring the size of the feature(s) while varying the exposure dose and focus of the exposure system. This process window has proven quite useful in showing how tolerant a feature is to varying amounts of process errors. The difficulty with this method, however, is that the resulting process window is not a single number but instead a function typically given by depth of focus (DOF) as a function of exposure latitude (EL).

Various methods are used to reduce this function to a single figure of merit, but to this point no method has delivered a figure of merit that accurately represents the expected performance of a real process. However, approximations to this can be made by computing a single value from the DOF vs. EL function. These values can include the max DOF, max EL or total window, which is the area under the DOF vs. EL function.

As feature sizes shrink more rapidly than exposure wavelength (actually the k1 factor is shrinking, where k1=min_half_pitch/(lambda/NA), where lambda is the wavelength and NA is the stepper's numerical aperture) and CD tolerances become more and more stringent, process windows are becoming extremely small. This drives the need for improved tooling and process control, along with more accurate process optimization methods. The rapid reduction in process window can be mitigated through the use of various resolution enhancement techniques. However, these techniques come at a cost: the need for optical proximity correction (OPC).

At low k1 imaging, significant modifications to mask designs are required to print features in the desired fashion on the wafer. Due to the extreme sensitivity of many of these features to errors on the mask, in the stepper lens or in the lithography process (focus and dose), it is critical that these mask design modifications be done properly. This entails two major components. The first is the generation of accurate rules for the modifications, and the second is the correct interpretation of these rules into design modifications. The second component is addressed by the optical proximity correction (OPC) software. This invention addresses the first component.

The current industry standard method for generating OPC and assist feature rules is to design test structures and measure the size of the structures after they have been printed on the wafer (this printing can be done physically or through simulation). Typically, interpolation is used to determine both the optimum mask dimension for any pitch that is contained in the set of test structures and also to determine biases for pitches that are not contained in this set. In this way, corrections can be determined from a set of test structures that spans the range of sizes and pitches in the design, but only samples this range. This is typically done at a single dose and focus value, and using a single point in the field for any given test structure. Therefore, this method may only account for a small subset of the systemic errors in the mask making or lithography process (e.g., nested-isolated bias) and can not account for any random errors in these processes. Furthermore, these random errors may confound the correction rules.

SUMMARY OF THE INVENTION

According to the invention, there is provided a method of generating OPC and assist feature rules which provide improved wafer performance under typical manufacturing variations. This method relies on finding common process windows or weighted process windows of test structures, so that the impact of focus and dose variations can be determined. Whereas, a common process window is computed by finding the overlap of two or more process windows, it suffers from the same drawbacks as an individual process window (namely, it is a function, not a single value, and it does not utilize real process information). A weighted process window (WPW), and, likewise, a weighted common process window, does not suffer from these limitations.

The process window (PW) or WPW for a pattern is computed by first finding the exposure-defocus (ED) tree for that pattern. The ED tree is a series of curves that represent the focus and dose conditions for a given pattern to print at its critical dimension (CD) tolerance limits. The area contained inside the curves represents process conditions (focus and dose) that yield patterns that are within specifications on the wafer, while the area outside of the curves represent process conditions that yield patterns that are either too large or too small on the wafer. The area can be further reduced by adding cut-offs where the pattern either falls over or does not print at all and a side lobe cutoff that represents conditions where undesirable side lobes print. At this point, a process window is computed by fitting rectangles inside the ED tree curves and then plotting the height of the rectangle versus its width. This gives a DOF vs. EL curve.

Alternatively, the WPW is computed by incorporating information on the expected focus and dose variations. These variations are represented statistically and could be taken independently or as a coupled distribution. These distributions must be known prior to computing the WPW and can be determined using experimental test structures. Standard focus and dose variation distributions are often approximated by Gaussian curves that are specified by their center location (focus and dose) and a measurement of their extent, sigma. These types of Gaussian distributions, or other types that better match the data can be centered inside the given ED tree and used as weighting functions. The WPW is then computed by finding the weighted area inside the ED tree, as given by $$WPW(E_0,F_0)=\Sigma\Sigma PW(F,E) \, DE(E;E_0) \, DF(F;F_0) \, dE \, dF,$$

where $PW(F,E)=1$ inside the ED tree curves, 0 outside the ED tree curves, and $DE(E;E_0)$ and $DF(F;F_0)$ are the distributions for dose (E) and focus (F) centered at $E_0$ and $F_0$. E is typically given as log(Dose). The summations are theoretically over all focus and dose conditions, but in practice are limited by the finite extent of the non-zero region of $PW(F,E)$.

Both the PW and WPW computations can be further expanded to account for other errors, such as mask CD errors or lens aberrations. By considering these variables in a manner similar to focus and dose, multidimensional functions can be computed that map out the conditions where the wafer image is within its tolerances. From these functions, multidimensional PW's or WPW's can be computed that quantify the pattern's tolerance to the given error components.

Finally, once the PW's or WPW's for various structures are computed, common PW's of these structure are found. By finding the common PW across a range of pattern spacings ranging from a minimum value out to isolate features, the amount of tolerable process variation can be computed for all feature spacings that may occur in a real design. The optimum mask dimensions for the main feature and the assist features can then be found by optimizing these common PW's. This optimization can be achieved efficiently by utilizing the PW information as a weighting factor and fitting curves to the mask parameters (e.g., edge bias, assist size and assist location) as a function of feature spacing. In this way, optimized OPC and assist feature rules can be determined.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
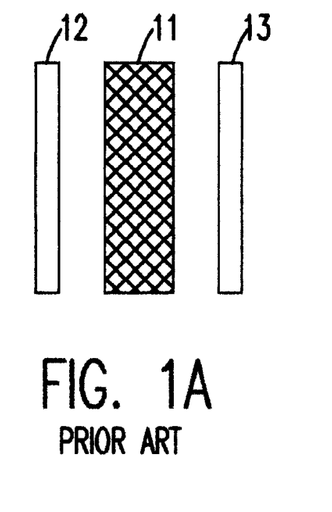
FIGS. 1A and 1B show mask pattern features with parallel assists used to determine rule modifications.
Figure 1B:
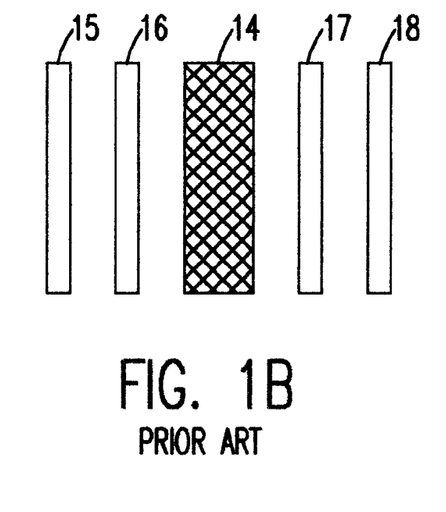

Referring now to the drawings, and more particularly to FIGS. 1A and 1B, there are shown mask patterns used in industry standard practice. FIG. 1A shows a line 11 with two fixed assist features 12 and 13 on either side of the line 11. FIG. 1B shows a line 14 with a pair of fixed assist features 15, 16 and 17, 18 on either side of the line 14. Industry standard practice is to use fixed assist feature sizes and placements with a maximum of two assists placed between two lines, or one per edge for an isolated line. The need for variable sizes and placements, along with multiple assist features (i.e., greater than two) is recognized, but generation of correction rules is difficult. For example, for pitches requiring 4 assists, there are at least 4 dimensions that can be varied. The result of this is that checking three values for each variable results in $3^4$ (3 to the fourth power) or 81 possible combinations.

Furthermore, the correction rule behavior tends to vary rapidly close to the spacing where an additional assist feature is added (the first spacing with an additional assist being called the "transition point"). Because of this, dense sampling in pitch is required. In addition, the use of multiple assists results in multiple valid solutions. Suppose, for example, that the patterns of FIGS. 1A and 1B both print the same size at best conditions. Which one should be used in the rules table? The answer to this question is not easily determined close to transitions. Process window analysis provides a method to determine best rules at all conditions and get the optimum benefit from the use of assists.

Figure 2A:
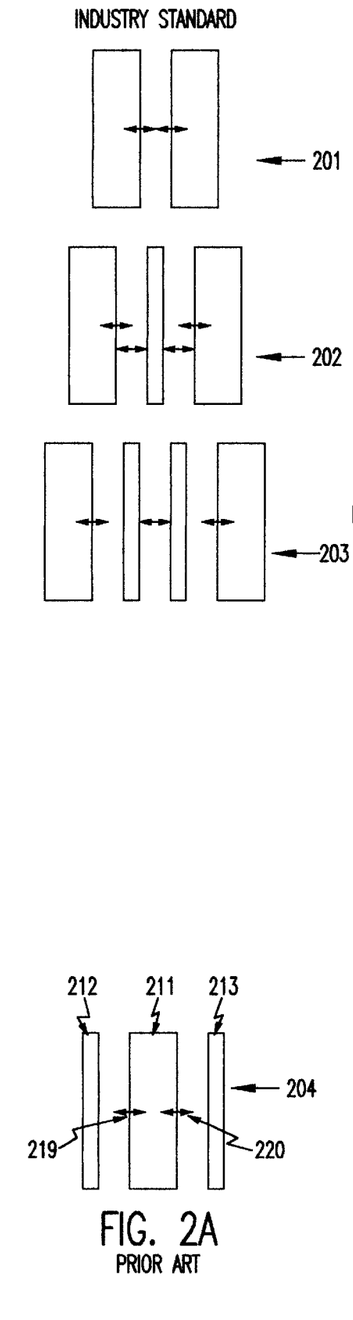
FIGS. 2A and 2B show mask pattern features respectively illustrating the industry standard and the multiple assist method according to the present invention.
Figure 2B:
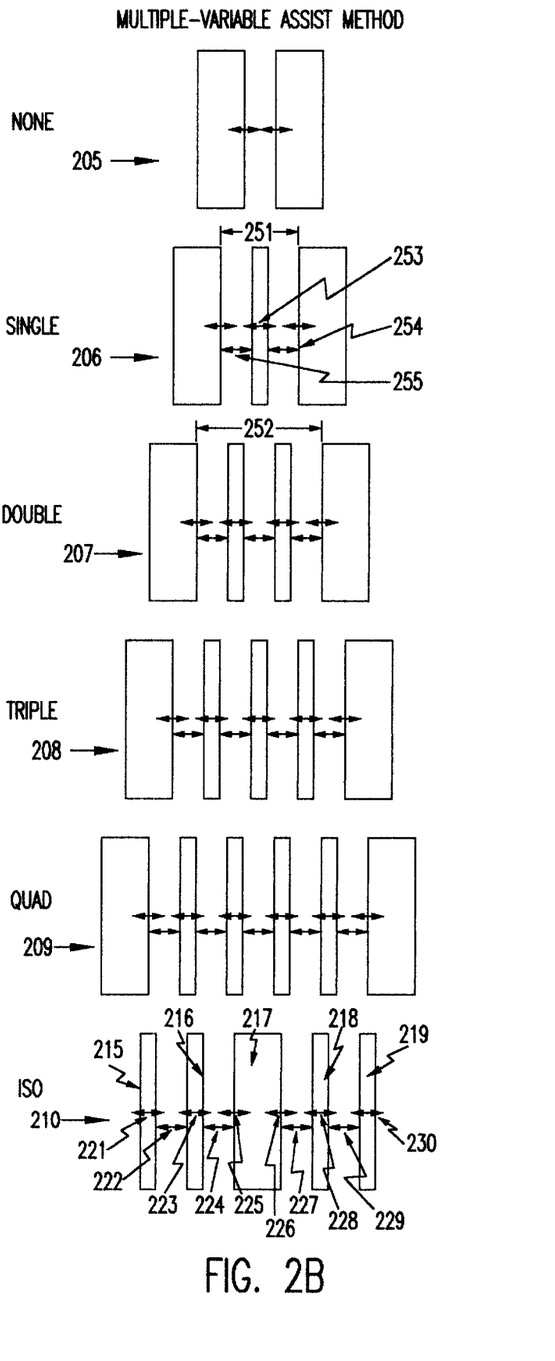

FIGS. 2A and 2B are views of mask pattern features respectively illustrating the industry standard (201–204) and the multiple-variable assist (205–210) method according to the present invention. In this figure, the spacing between two critical features is increased from the top of the figure to the bottom. As the spacing is increased, the number of assist features placed in the space can be increased. The example layouts shown (201–210) represent a single spacing at which the number of assists shown can be used. So, for spacing 251, a single assist can be placed in the space and, for spacing 252, two assists can be used. Note that the multiple-variable assist method allows for up to 4 assists in space between two critical lines, while the industry standard method only allows 2. (Actually, the multiple-variable assist method allows an unlimited number of assists and provides a methodology for determining the correct number to use).

In practice, the spacing can vary continuously (constrained by the design grid) between the values represented in this figure (e.g., 251 and 252). For a spacing falling between those shown, one must first determine if the smaller or the larger number of assists should be used. This is equivalent to determining the transition points. Next, one or more parameters of the assist feature rules must be adjusted to fill the space. The parameters that are typically adjusted in the industry standard and the multiple-variable assist method are shown by the double-headed arrows (e.g., 253–255). For example, as the spacing is increased from 251 to 252, a single assist could be used that was allowed to grow slightly larger (increase 253) while moving away from the edge of the lines (increasing 254 and 255).

The quad assist condition in FIG. 2B (210) demonstrates the example discussed above. Here, 10 variables are shown (221–230). Due to symmetry, however, this is reduced to 5(since the left edge of line 217 and its assists should be consistent with the right edge and its assists, which leads to: 221=230, 222=229, 223=228, 224=227, 225=226). By constraining the assists to all be the same size, the number of variables is reduced to 4, since 221=223=228=230.

Figure 3:
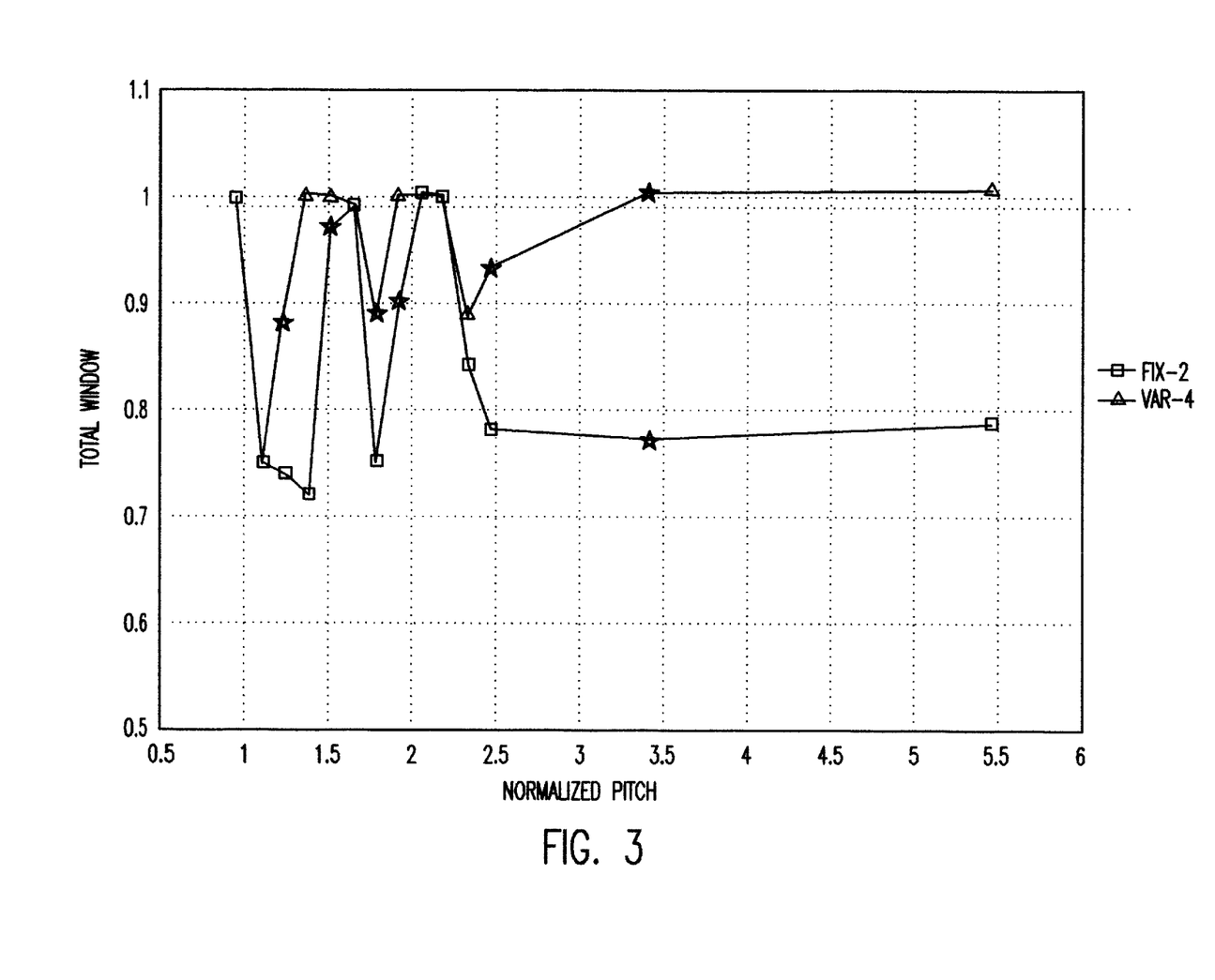
FIG. 3 is a graph showing the process windows for the industry standard method and the multiple-variable assist method.

FIG. 3 is a graph showing the benefit of using multiple-variable assists rather than the industry standard method. Here, the total process window is plotted as a function of pitch. The various peaks occur at regions employing different numbers of assist features. The transition points are shown by star markers. It can be seen that the multiple-variable assist method allows the transitions to occur at smaller pitches. Likewise, the PW for isolated lines is significantly better for the multiple-variable assist method. This type of plot also provides a means to determine the spacings at which to add another assist (i.e., the transition points). When the process window with the additional assist is larger than that without it, then the transition should be made. Due to the importance of these curves in determining the optimum OPC and assist feature rules, it is critical that they be generated properly.

The first step in generating OPC and assist feature rules is choosing a reference pitch and finding the mask bias that optimizes the process window for this pitch. This can be done using standard process window (PW) analysis or through a weighted process window (WPW) analysis which accounts for focus and dose distributions that are expected in a real process. The WPW analysis gives not only the optimum mask bias, but also the center focus and dose conditions for the optimum process centering.

A series of other pitches and mask biases are then analyzed by finding the common process window with the reference pitch. For the standard PW analysis, a common process window is found. For the WPW analysis, the WPW is computed at the center focus and dose conditions found for the reference pitch. If mask or lens errors are to be accounted for, then multiple structures can be included in the analysis.

A couple levels of sophistication can be employed here. The most basic method is to compute a common process window over a range of errors equivalent to the expected errors. A more sophisticated approach would be to generate a multidimensional process window that fit functional forms to the error sources. This method generalizes the conventional two-dimensional exposure-defocus (ED) window analysis to a multidimensional process volume, such as a three-dimensional mask-exposure-defocus volume (MED volume).

Figure 4:
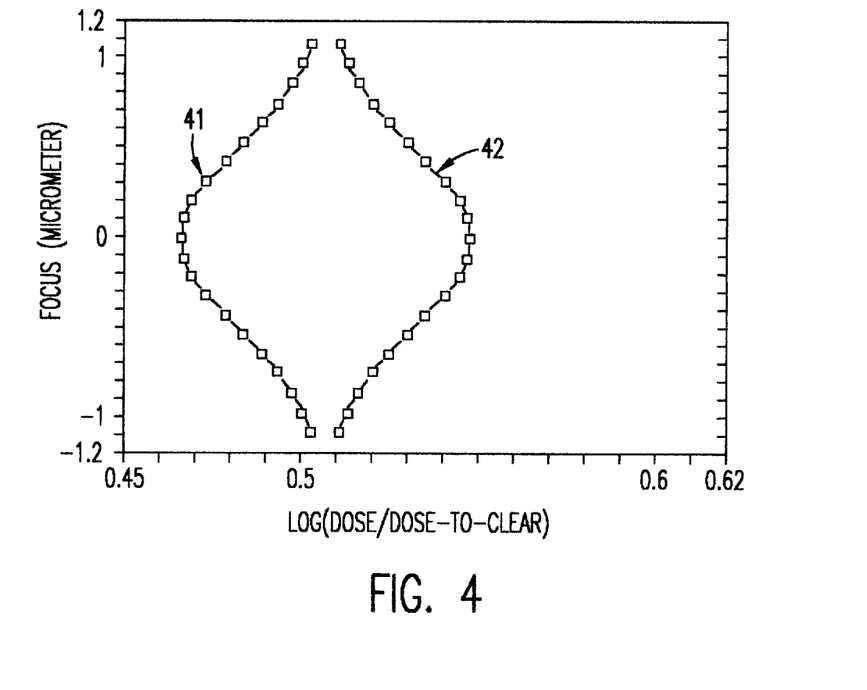
FIG. 4 is a graph showing a range of focus and dose values bounding an exposure-defocus (ED) window for a specific example.
Figure 5:
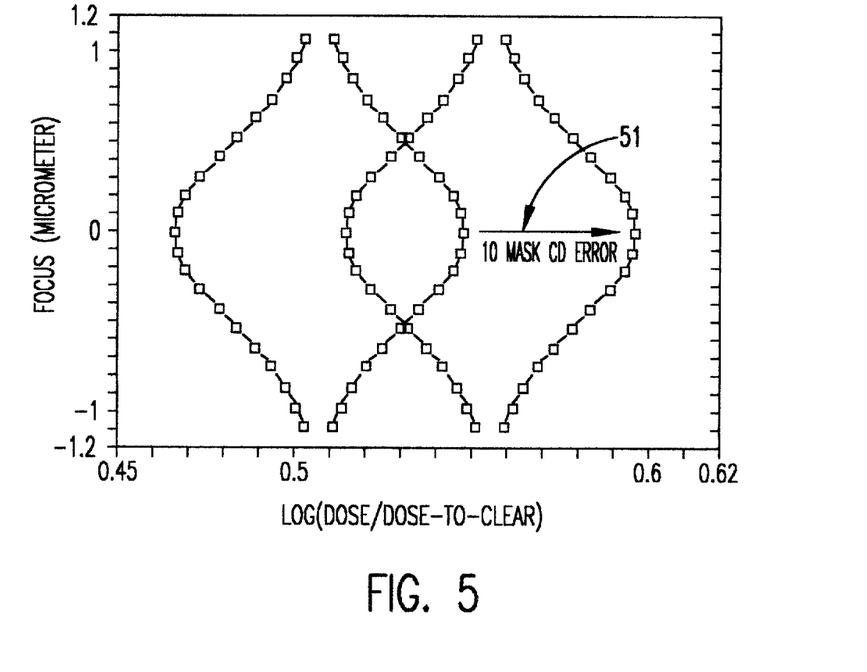
FIG. 5 is a graph showing the ED window of FIG. 3 displaced in the dose direction.

Take the printing of a 1:1 150 nm equal line-space pattern with annular illumination on a $\lambda 248$ nm, NA=0.68 exposure system for example. Suppose the critical dimension (CD) tolerance is ±10% (±15 nm), the range of focus and dose values in which the 150 nm line prints within specification is bounded by the left (41) and right (42) curves of the ED window in FIG. 4. The primary effect of a reasonable amount of mask CD error is to displace the ED window in the dose direction as shown in FIG. 5, the displacement (51) being proportional to the mask error factor (MEF). Now if mask CD error is made the third axis and ED windows of various amounts of mask CD errors are placed in this three-dimensional space, a mask-exposure-defocus volume results.

Figure 6:
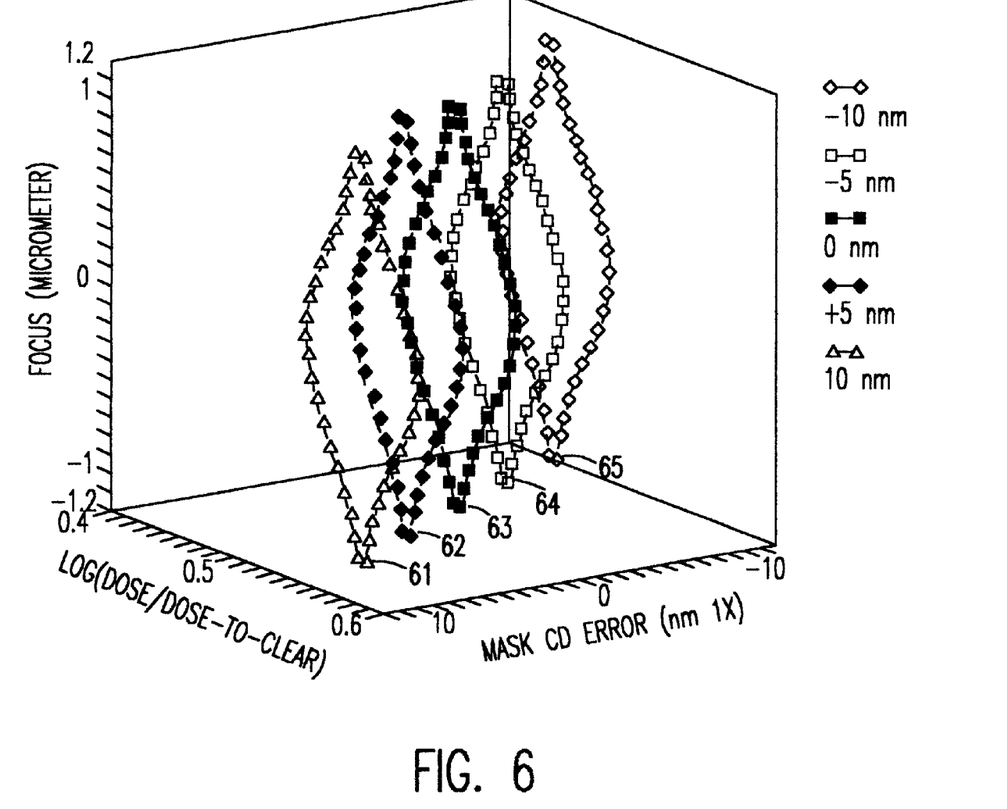
FIG. 6 is a graph in which the mask critical dimension (CD) error is made the third axis and ED windows of various amounts of mask CD errors are placed in this three-dimensional space.

FIG. 6 shows slices (61–65) through the MED volume. Using this plot, it is possible to associate with a feature not only its exposure latitude and depth-of-focus (DOF), but also its mask tolerance, which is the amount of mask CD error above which the printed size becomes out of specification. The 150 nm line in our example has an exposure latitude of 19%, a depth-of-focus of 1.78 $\mu$m, and a mask tolerance of 17.6 nm (1X). It is also possible to compute a value representing the total process window. This would be equal to the multidimensional volume enclosed by the curves. Ultimately, a weighted multi-dimensional, process window could be computed that accounted for the expected distributions of all error sources.

Ideally, the OPC and assist feature rules are found by experimentally determining the optimum common process window for all line widths and spacings of interest. In practice, however, it is more likely that only a relatively small sampling of all the possible line widths and spacings will be used. This sampling of relevant features is typically done using a test mask, which may not only have a small number of feature sizes and spacings, but may also be designed on a grid that does not match the product design grid. The result of this is that the sizes and spacings on the test mask may not exactly match actual sizes and spacings that occur in product designs. Furthermore, the design grids of the test mask and product masks do not necessarily correspond to the grid size that will be used to write the final product masks. This "write grid" or "OPC grid" is typically a fraction of the product design grid (e.g., one-fourth). The net result of all these factors is that the rules generation method must provide a means to properly interpolate between a test mask design and the final product mask design.

Figure 7:
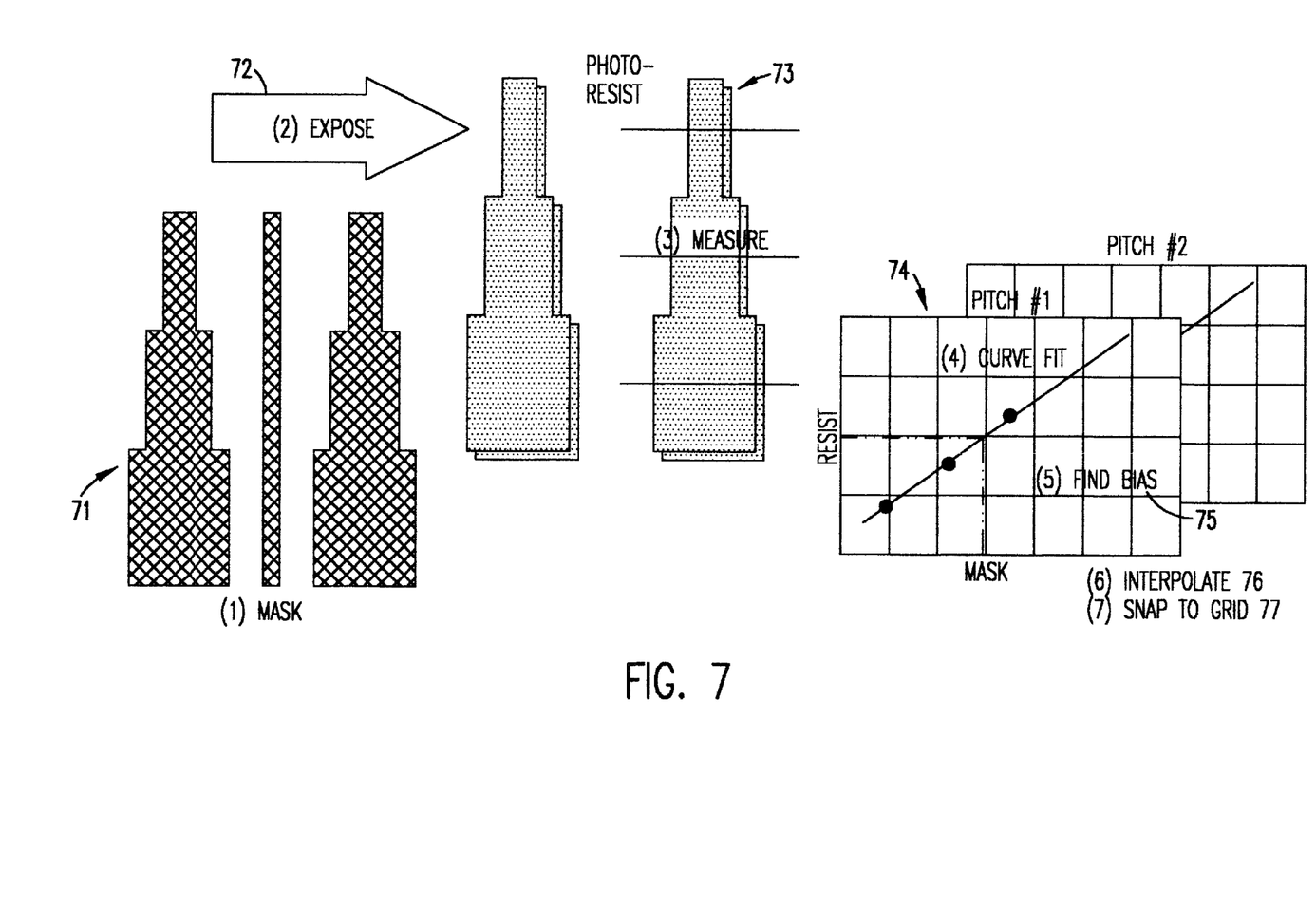
FIG. 7 is a flow diagram illustrating the process of assist rules generation according to the industry standard.
Figure 8:
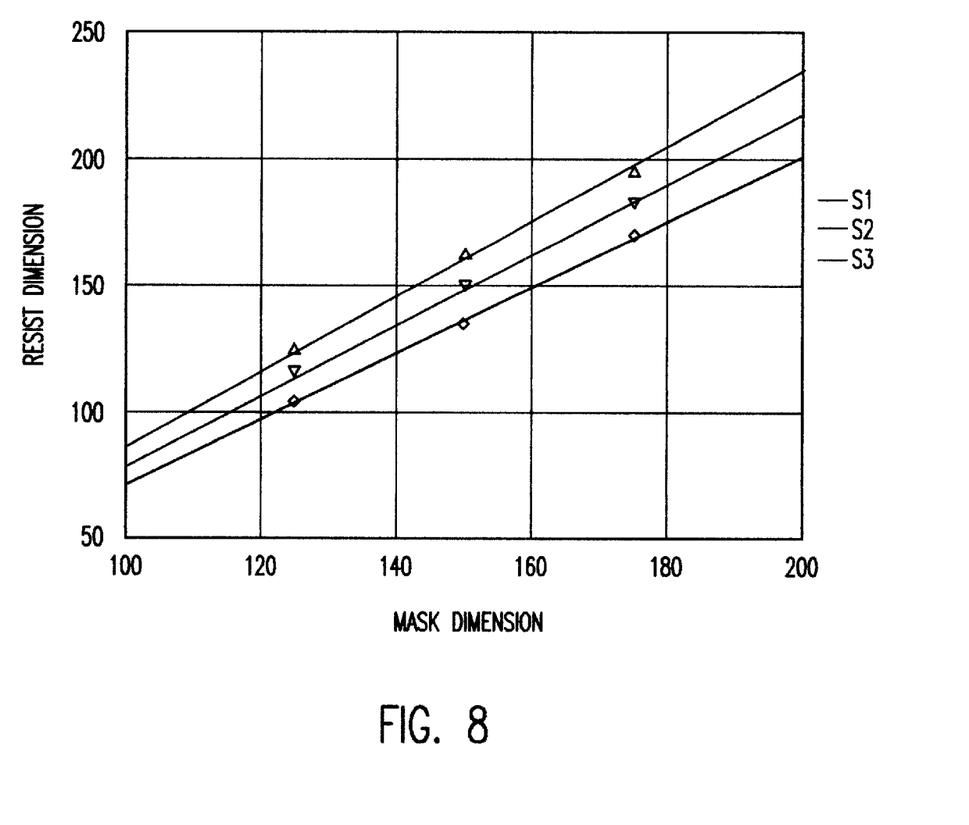
FIG. 8 is a graph showing the line width curve fit for various spacings.

The industry standard method of assist rules generation is shown in FIG. 7. The process begins in step 71 with design test structures with 0, 1 and 2 assists using fixed sizes and placements. The wafers are exposed in step 72 at best focus and dose, and the line width (LW) on all test structures are measured in step 73. Curves are fitted to printed LW versus mask bias for each pitch in step 74, keeping assist size and placement constant. The line width curve fits for 3 spacings are illustrated by the graph of FIG. 8. Then in step 75, a determination is made as to the best bias to give the desired printed LW at each pitch. The results are interpolated in step 76 to find the bias at the pitch of interest for a given technology. Note that this technology is not necessarily represented on the test mask. Finally, the process snaps to the grid in step 77.

Figure 9:
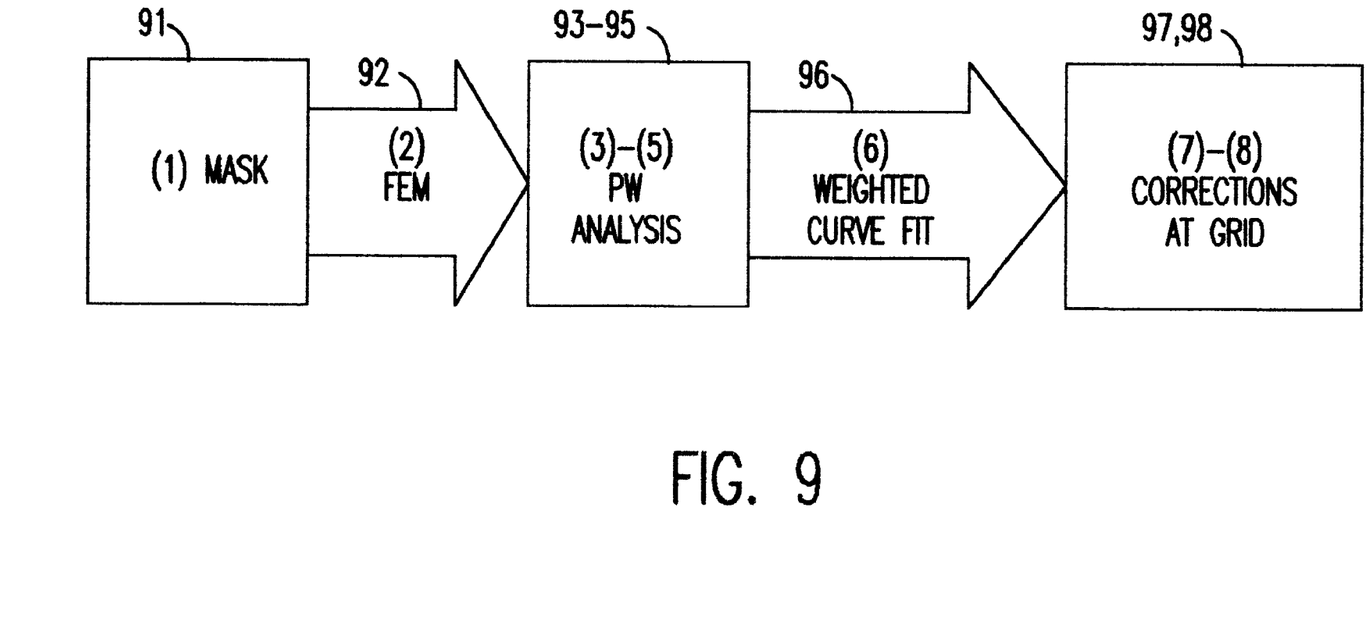
FIG. 9 is a flow diagram showing the process of assist rules generation using the process window method according to the invention.

The assist rules generation according to the present invention is illustrated in FIG. 9. The first step 91 is to design test structures with 0 to 4 assists using variable sizes and placements as illustrated in FIG. 2B. These test structures are used to expose a focus-expose matrix (FEM) in a photoresist on wafers in step 92. The process window (PW) analysis is carried out in steps 93 to 95. More particularly, in step 93, the line width (LW) on all test structures is measured. Then, in step 94, the optimum process window (PW) is found at a reference pitch by optimizing the bias. For all other pitches, the common PW with the reference pitch is found in step 95. Next, in step 96, curves are fitted to the edge bias, assist sizes and locations as a function of the designed space. Alternatively, the OPC parameters may be found as a function of the normalized space, wherein the normalized space is defined as the designed space divided by one more than the number of assists used in the space.

Polynomial fits are generally sufficient if a small range of spacing is considered. This curve fitting is more robust if the curves are not fit just to the ideal conditions, but instead are fit to all of the data. To accomplish this, the fitting routines can use a weighting value for each data point. This weighting can be set in a couple of different ways. First, a figure of merit value for the PW (e.g., DOF, EL, or total window;) can be used, which will give more weight to conditions with a large process window. The result of this approach is that the fitted curves tend to determine the OPC parameters that optimize the figure of merit, or optimization parameter, for all spacings of interest. An improvement upon this is to use the figure of merit raised to some power, such as the fourth power, which gives more weight to conditions closer to the optimum. This weighting power can be adjusted to match the quality of the data, with higher powers being used for cleaner data. A further improvement would be to add a term inversely proportional to the step size of the test structures.

Figure 10:
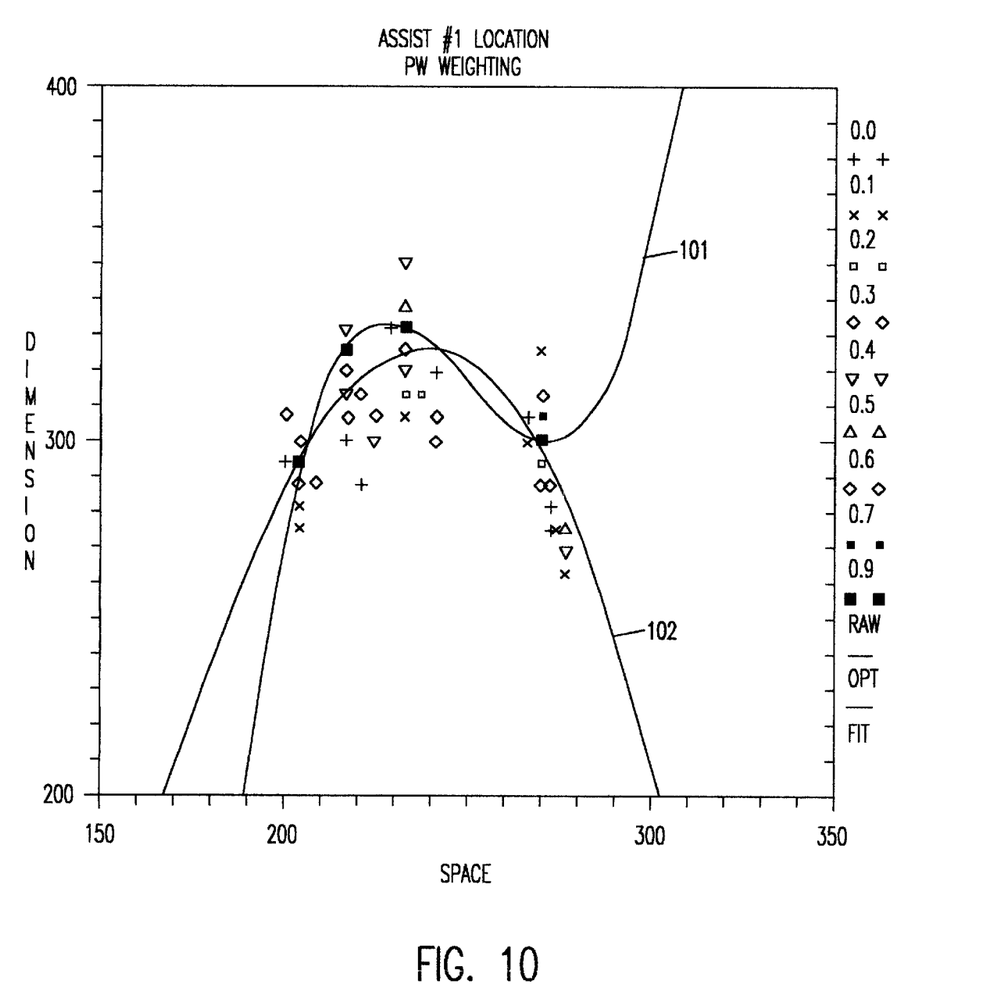
FIG. 10 is a graph showing a weighted curve fit.

FIG. 10 is a graph showing a weighted curve fit for the assist placement versus a curve to fit strictly the optimum placement values for each spacing on the test mask. Here, a third-order polynomial is fit to either 4 values for the optimum-only case (curve 101) or about 50 values for the PW weighted case (curve 102). The result is a smoother, better behaved curve for the weighted curve.

Finally, once the functional forms have been found for each of the OPC parameters, the rules table can be determined by solving for the spacings of interest in the design (step 97 in FIG. 9). The number of assist features to use for a given spacing is determined by comparing the process windows for different numbers of assists. Once the number of assists is determined, the correct curve fit parameters can be used to determine the rules. The mask sizes should then be checked against a set of mask manufacturability rules to ensure that the mask dimensions will be manufacturable. These manufacturing rules include the minimum main feature size, the minimum and maximum assist feature sizes, and the minimum spacings between features. These manufacturability checks are especially important close to the transition points and, if they are violated, then the transition points may need to be adjusted to remove the violation. Finally, the rules table is snapped to the mask writing grid (step 98). While rules table generation has been done in the past, it has been done only using feature size measurements at best conditions. The solution of this invention accounts for the multitude of errors that can be present in a real process.

The benefits of the process window (PW) method according to the invention are many. First, it facilitates the use of multiple assists and variable sizes and placements by resolving redundancies. It also optimizes the process window to print features. The PW method provides flexibility in optimization parameter, including depth-of-focus (DOF), exposure latitude and total window. The process is extendible to account for other error sources such as mask critical dimension (CD) errors and lens aberrations. It is also extendible to use advanced PW analysis such as multidimensional PW and weighted PW, providing simplified and more accurate methodology and incorporating real process information.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method to determine optical proximity correction and assist feature rules which account for variations in mask dimensions, exposure tool and process in the manufacture of an integrated circuit, comprising steps of:

choosing a reference pitch and finding mask bias for features of interest which optimize a process window;

analyzing a series of other pitches and mask biases for features of interest by finding a common process window with the reference pitch;

computing functional fits to data found for the common process window for the mask features of interest; and determining a rules table by solving the functional fits for spacings of interest in a product design.

2. The method of claim 1, wherein said reference pitch is approximately equivalent to the minimum pitch allowed in said product design.

3. The method of claim 2, wherein said reference pitch is sufficiently small so that no assist features can be placed in the space between two main features.

4. The method of claim 3, wherein said reference pitch is optimized by finding the main feature bias that optimizes the process window for this pitch.

5. The method of claim 2, wherein said mask bias is such that on the mask, said reference pitch has approximately a 1:1 line-space ratio.

6. The method of claim 1, wherein said common PW is weighted PW, which incorporates expected focus and dose distributions.

7. The method of claim 1, wherein said common PW is multi-dimensional PW, which incorporates sources of error other than focus and does.

8. The method of claim 7, wherein other sources include mask CD errors, lens aberrations and exposure tool flare.

9. The method of claim 7, wherein said multi-dimensional PW is weighted multi-dimensional PW, which incorporates expected distributions of all variables.

10. The method of claim 1, wherein said reference pitch and said other pitches include features that are printed in photoresist at a dimension that is consistent with the minimum sized features in said product design.

11. The method of claim 10, wherein said minimum sized feature is printed in photoresist at a dimension smaller than its designed size.

12. The method of claim 1, wherein said mask features of interest include main feature edge bias, assist feature sizes, and assist feature locations.

13. The method of claim 12, wherein up to four assists can be placed in said spacing of interest.

14. The method of claim 12, wherein more than four assists can be placed in said spacing of interest.

15. The method of claim 12, wherein all assist features have the same size.

16. The method of claim 12, wherein assist features placed in the center of a space can differ in size by one grid point from all other assist features, all other assist features being the same size.

17. The method of claim 1, wherein said rules table includes transition points which are spacings where an additional assist feature is added, so that spacings greater than or equal to a transition point have at least one more assist feature than spacings less than that transition point.

18. The method of claim 17, wherein said transition points are determined by comparing said common process windows utilizing differing number of assist features at the same spacing.

19. The method of claim 18, wherein said transition point is set at the spacing where adding an additional assist feature improves said common process window over not adding an additional assist feature, provided that adding an additional assist feature does not violate any mask manufactureability rules.

20. The method of claim 19, wherein said mask manufactureability rules include minimum main feature size, minimum assist feature size, maximum assist feature size, minimum spacing from assist feature to main feature, and minimum spacing from assist feature to assist feature.

21. The method of claim 1, wherein said functional fits are curve fits to sets of data.

22. The method of claim 21, where said curve fits are computed by weighting each member of said set by a weighting function of said common process window for that member.

23. The method of claim 22, wherein said weighting function is of the form PW to the n power, wherein PW is a measurement of the common process window.

24. The method of claim 23, wherein n is adjusted depending on the amount of noise in said set of data.

25. The method of claim 23, wherein n falls in the range of $2 \leq n \leq 10$.

26. The method of claim 22, wherein said weighting function is also a function of the step size between mask features of interest utilized in said set of data.

27. The method of claim 21, wherein multiple independent curve fits are computed on multiple independent sets of data, each data set corresponding to mask layouts that employ the same number of assist features in the space between two main features.

28. The method of claim 27, wherein said curve fits are to polynomial functions for said mask features of interest as a function of the spacing between the designed main features.

29. The method of claim 27, wherein said curve fits are to polynomial functions for said mask features of interest as a function of normalized spacing.

30. The method of claim 29, wherein the normalized spacing is defined as the spacing between the designed main features divided by one more than the number of assist features placed in that spacing.

31. The method of claim 29, wherein the normalized spacing is defined as the spacing between the designed main features divided by one more than the number of assist features placed in that spacing, except for the case wherein no assist features are placed in this space, in which case the normalized spacing is defined as the spacing between the designed main features divided by two.

32. The method of claim 21, wherein said sets of data are determined by measuring test patterns on wafers that are processed in a manner similar to that used to process wafers using said product design.

33. The method of claim 32, wherein said test patterns are created by exposing a test photomask.

34. The method of claim 33, wherein said test photomask is designed at a design grid that differs from the design grid of said product design.

35. The method of claim 32, wherein said test patterns are created by exposing patterns found in a kerf or scribe of a product design.

36. The method of claim 1, wherein said rules table is determined at a grid that differs from said product design grid.

37. The method of claim 36, wherein said rules table grid is equal to said product design grid divided by an integer.

38. The method of claim 23, wherein said PW is equal to a value or a combination of values from a group of measurements consisting of: maximum depth of focus, maximum exposure latitude, depth of focus at 10% exposure latitude, and total window.

* * * * *